US005479114A

United States Patent [19]

Miura

[11] Patent Number: 5,479,114
[45] Date of Patent: Dec. 26, 1995

[54] THREE-VALUE INPUT BUFFER CIRCUIT

[75] Inventor: Tadahiko Miura, Tokyo, Japan

[73] Assignee: NEC Corporation, Tokyo, Japan

[21] Appl. No.: 329,161

[22] Filed: Oct. 26, 1994

[30] Foreign Application Priority Data

Nov. 10, 1993 [JP] Japan .................................. 5-280990

[51] Int. Cl.$^6$ ...................... H03K 19/0948; H03K 19/00
[52] U.S. Cl. .................. 326/60; 326/21; 326/58; 341/57
[58] Field of Search ........................... 326/59–60, 57–58, 326/21, 121, 83; 341/56–57; 327/543, 544

[56] References Cited

U.S. PATENT DOCUMENTS

| 5,124,590 | 6/1992 | Liu et al. ................................. | 326/60 |
| 5,194,766 | 3/1993 | Sugawara ................................. | 326/60 |
| 5,373,202 | 12/1994 | Armstrong, II ........................... | 326/58 |

FOREIGN PATENT DOCUMENTS

| 589221 | 9/1992 | European Pat. Off. .................. | 326/60 |

*Primary Examiner*—Edward P. Westin
*Assistant Examiner*—Jon Santamauro
*Attorney, Agent, or Firm*—Whitham, Curtis, Whitham & McGinn

[57] ABSTRACT

A 3-value input buffer circuit is configured by a first N-channel MOS transistor whose source is connected to an input terminal, a first P-channel MOS transistor which is connected to the first N-channel MOS transistor, a first inverter whose input is connected to a drain of the first P-channel MOS transistor, a second P-channel MOS transistor whose source is connected to the input terminal, a second N-channel MOS transistor which is connected to the second P-channel MOS transistor, a second inverter which is connected to a drain of the second N-channel MOS transistor, and a voltage applying circuit which is constituted by P-channel MOS transistors and which applies a constant voltage to a gate of each of the first N-channel MOS transistor and the second P-channel MOS transistor. The first N-channel MOS transistor and the second P-channel MOS transistor are cut off when the input terminal is in an open state. Thus, the power consumption can be significantly suppressed.

8 Claims, 2 Drawing Sheets

THREE-VALUE INPUT BUFFER CIRCUIT

BACKGROUND OF THE INVENTION (1) Field of the Invention

The present invention relates to a 3-value input buffer circuit, and more particularly to a 3-value input buffer circuit adapted to an integrated circuit of a complementary MOS configuration.

(2) Description of the Related Art

Conventionally, a 3-value input buffer circuit of the kind to which the present invention relates is used in a circuit such as a complementary type MOS integrated circuit.

A conventional 3-value input buffer circuit is shown in FIG. 1. As shown therein, this 3-value input buffer circuit is constituted by a voltage dividing circuit which has resistors 14 and 15 connected to an input terminal 1 and two inverters whose circuit threshold voltages are different from each other. That is, the first one of the two inverters is constituted by a P-channel MOS transistor (hereinafter referred to as a "PMOS") 21 and an N-channel MOS transistor (hereinafter referred to as an "NMOS") 22, and is connected between an input terminal 1 and a first output terminal 2. Similarly, the second one of the two inverters is constituted by a PMOS 23 and an NMOS 24 and is connected between the input terminal 1 and a second output terminal 3. In this buffer circuit, the three levels of the common input terminal 1, namely, a high level, a low level and an open level, are detected, and the levels of the input terminal 1 are conveyed to internal circuits through the first output terminal 2 and the second output terminal 3.

The circuit threshold voltage of the complementary MOS type inverters explained above is given by the following equation (1):

$$V_T = \frac{\beta_1 (V_{DD} + V_{TP}) + V_{TN}}{1 + \beta_1} \quad (1)$$

$$\text{where, } \beta_1 = \left( \frac{K_P \times W_P/L_P}{K_N \times W_N/L_N} \right)^{1/2}$$

In the above equation (1), $V_{Tp}$, $K_p$, $W_p$ and $L_p$ represent respectively a threshold voltage, a mutual conductance, a gate width and a gate length of the PMOS. Similarly, $V_{TN}$, $K_N$, $W_N$ and $L_N$ represent respectively a threshold voltage, a mutual conductance, a gate width and a gate length of the NMOS.

In the foregoing 3-value input buffer circuit, if the circuit threshold voltage of the first inverter is to be set to 2.5V, the values concerned will be Wp=11.2 μm, $L_p$=2 μm, $W_N$=5 μm and $L_N$=2 μm. Likewise, if the circuit threshold voltage of the second inverter is to be set to 1.5V, the values concerned will be $W_p$=5 μm, $L_p$=2 μm, $W_N$=8.5 μm and $L_N$=2 μm. This, however, is on the assumption that $V_{Tp}$=−0.8V, $V_{TN}$=0.7V, $K_p$=20μ and $K_N$=40μ.

FIG. 2 is a circuit diagram showing an example of another conventional 3-value input buffer circuit. As shown therein, this buffer circuit is equipped with a first inverter of a high circuit threshold voltage formed by PMOSs 25 and 26 and a second inverter of a low circuit threshold voltage formed by NMOSs 27 and 28. A voltage dividing circuit is constituted by resistors 14 and 15, and an intermediate point thereof is connected to a common input terminal 1 of the first inverter and the second inverter.

Similarly as in the example given above, the circuit threshold voltage of the first inverter constituted by the PMOSs 25 and 26 is given by the following equation (2):

$$V_T = \frac{\beta_2 (V_{DD} + V_{TP1}) - V_{TP2}}{1 + \beta_2} \quad (2)$$

$$\text{where, } \beta_2 = \left( \frac{K_{P1} \times W_{P1}/L_{P1}}{K_{P2} \times W_{P2}/L_{P2}} \right)^{1/2}$$

In the above equation (2), $V_{TP1}$, $K_{P1}$, $W_{P1}$ and $L_{P1}$ represent respectively a threshold voltage, a mutual conductance, a gate width and a gate length of the PMOS 25. Similarly, $V_{TP2}$, $K_{P2}$, $W_{P2}$ and $L_{P2}$ represent respectively a threshold voltage, a mutual conductance, a gate width and a gate length of the PMOS 26.

On the other hand, the circuit threshold voltage of the second inverter constituted by the NMOSs 27 and 28 is given by the following equation (3):

$$V_T = \frac{\beta_3 (V_{DD} - V_{TN2}) + V_{TN1}}{1 + \beta_3} \quad (3)$$

$$\text{where, } \beta_3 = \left( \frac{K_{N2} \times W_{N2}/L_{N2}}{K_{N1} \times W_{N1}/L_{N1}} \right)^{1/2}$$

In the above equation (3), $V_{TN1}$, $K_{N1}$, $W_{N1}$ and $L_{N1}$ represent respectively a threshold voltage, a mutual conductance, a gate width and a gate length of the NMOS 28, and $V_{TN2}$, $K_{N2}$, $W_{N2}$ and $L_{N2}$ represent respectively a threshold voltage, a mutual conductance, a gate width and a gate length of the NMOS 27.

In the foregoing 3-value input buffer circuit, if the circuit threshold voltage of the first inverter is to be set to 2.5V, the values concerned will be $W_{P1}$=7.3 μm, $L_{P1}$=2 μm, $W_{P2}$=5 μm and $L_{P2}$=2 μm. Likewise, if the circuit threshold voltage of the second inverter is to be set to 1.5V, the values concerned will be $W_{N1}$=34.5 μm, $L_{N1}$=2 μm, $W_{N2}$=5 μm and $L_{N2}$=2 μm. This, however, is on the assumption that $V_{TP1}$=−0.8V, $V_{TP2}$=−1.5V, $V_{TN1}$=0.7V, and $V_{TN2}$=1.4V. Here, large values of $V_{TP2}$ and $V_{TN2}$ are due to substrate biasing effects.

In the former example of the two conventional 3-value input buffer circuits explained above, there is a defect that, for obtaining a desired circuit threshold value, the areas of the respective transistors will become large, and there is also a defect that, since two complementary MOS type inverters are used, the circuit will likely be affected by variations in threshold voltages of the MOS transistors, thereby making it difficult to design the circuit.

In the latter example, the defects as compared with the former example have been reduced. However, since the inverter is constituted by the MOS transistors of the same polarity, there is a defect in that a through-current flows even when the input terminal is in an open state. That is, the through-current of about 100 μA flows in the example explained above. Generally, in the case of the 3-value input buffer circuit, the input terminal often turns to an open state in its normal state, The flow of the through-current presents a problem in that current consumption cannot be effectively suppressed.

SUMMARY OF THE INVENTION

An object of the invention, therefore, is to overcome the problems existing in the prior art and to provide a 3-value input buffer circuit in which the area occupied by each transistor does not become large, the influence from variations in threshold voltages is less likely, and the power consumption caused by through-currents can be suppressed.

According to one aspect of the invention, there is provided a 3-value input buffer circuit comprising:

a power source terminal and a ground terminal;

an input terminal whose input state assumes an open level, a high level and a low level;

a first N-channel MOS transistor having a source connected to the input terminal;

a first P-channel MOS transistor having a gate and a drain both connected to a drain of the first N-channel MOS transistor and a source connected to the power source terminal;

a first output circuit having an input node coupled to the drain of the first P-channel MOS transistor and an output node connected to a first output terminal;

a second P-channel MOS transistor having a source connected to the input terminal;

a second N-channel MOS transistor having a gate and a drain both connected to a drain of the second P-channel MOS transistor and a source connected to the ground terminal;

a second output circuit having an input node coupled to the drain of the second N-channel MOS transistor and an output node connected to a second output terminal; and a voltage applying means which applies a constant voltage to a gate of each of the first N-channel MOS transistor and the second P-channel MOS transistor.

With the 3-value input buffer circuit according to the invention, it is possible to obtain, at the first and second output terminals, outputs corresponding to a high, a low and an open state of the common input terminal and, moreover, since both the first N-channel MOS transistor and the second P-channel MOS transistor are in a cut-off state during the open state of the input terminal, it is possible to suppress the power consumption to be extremely small.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1:
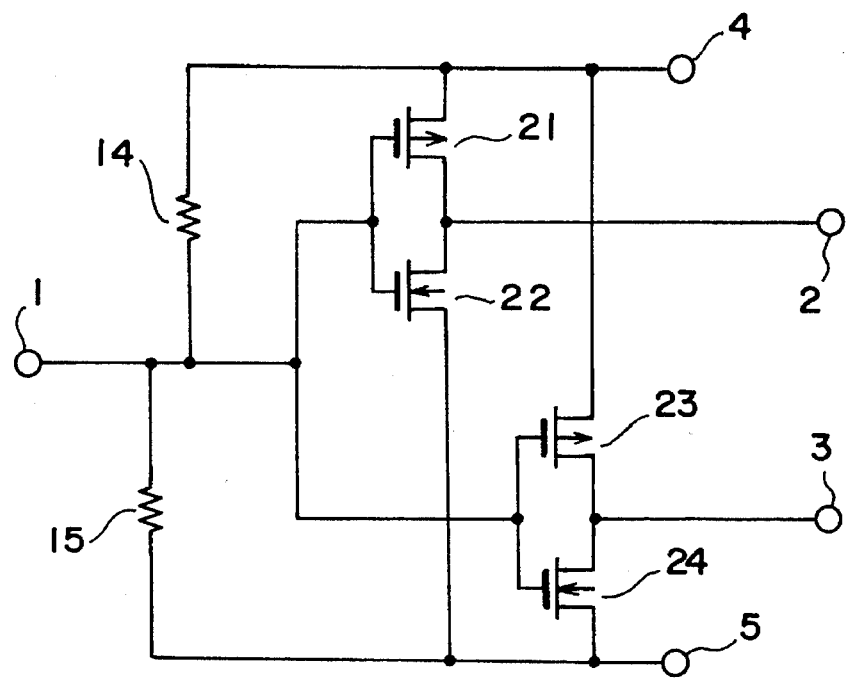
FIG. 1 is a circuit diagram showing an example of a conventional 3-value input buffer circuit.
Figure 2:
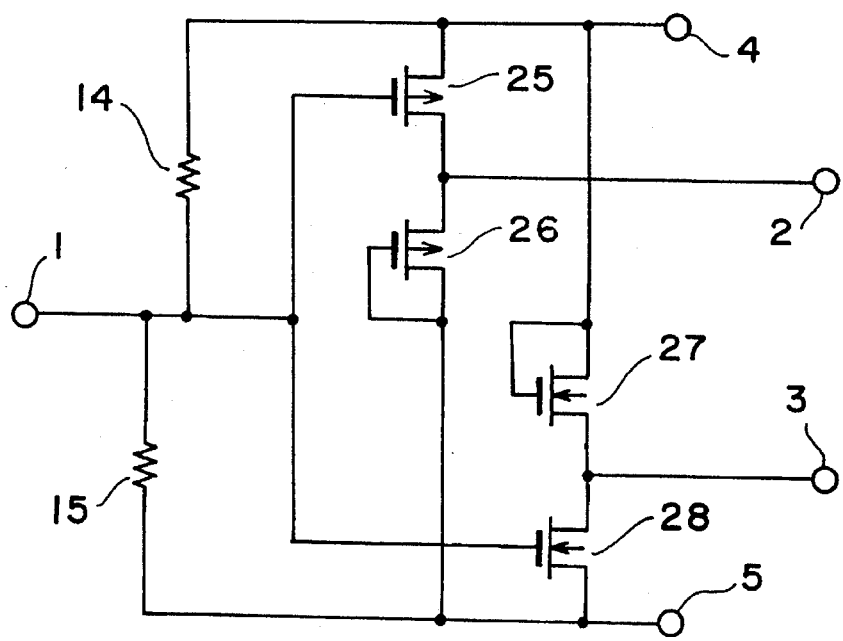
FIG. 2 is a circuit diagram showing another example of a conventional 3-value input buffer circuit.
Figure 3:
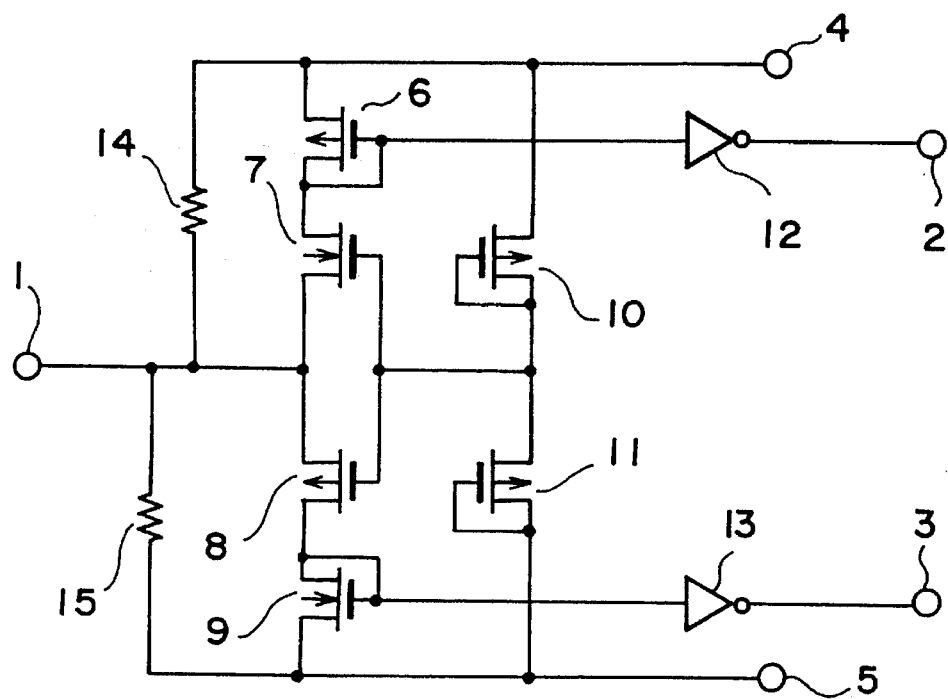
FIG. 3 is a circuit diagram showing a first embodiment of a 3-value input buffer circuit according to the invention.

FIG. 3 shows in a circuit diagram a 3-value input buffer circuit of a first embodiment according to the invention. As shown therein, the circuit of this embodiment is constituted by a first NMOS 7, a first PMOS 6 and a resistor 14 that are connected between an input terminal 1 and a power supply terminal 4; a second PMOS 8, a second NMOS 9 and a resistor 15 that are connected between the input terminal 1 and a ground terminal 5; and a first output inverter 12 and a second output inverter 13 that are respectively connected to a first output terminal 2 and a second output terminal 3. In addition thereto, there is a voltage dividing circuit which operates as a voltage applying means and which is connected between the power supply terminal 4 and the ground terminal 5. The voltage dividing circuit is constituted by PMOSs 10 and 11. The potential at an intermediate point of the PMOS 10 and the PMOS 11 connected in series is set to 2.5V and this voltage is applied to a gate of each of the first NMOS 7 and the second PMOS 8. Furthermore, as explained above, the respective sources of the first NMOS 7 and the second PMOS 8 are commonly connected to the input terminal 1.

In the 3-value input buffer circuit described above, when the potential of the input terminal 1 falls to a level lower than $(2.5V-V_{TN})$, the first NMOS 7 becomes conductive and, at a voltage above that potential, the first NMOS 7 turns to a cut-off state. On the other hand, the second PMOS 8 becomes conductive when the potential of the input terminal 1 rises to above $(2.5V+V_{TP})$ and, at a voltage below that potential, the second PMOS 8 turns to a cut-off state. Here, $V_{TN}$ and $V_{TP}$ represent threshold voltages of the respective transistors as in the description made above for the conventional examples.

In this embodiment, too, in order to apply a bias voltage to the input terminal 1, the resistors 14 and 15 are connected in series between the power supply terminal 4 and the ground terminal 5 and an interconnected point between these resistors 14 and 15 is connected to the input terminal 1. In this embodiment, the potential at this interconnected point is set to 2.5V.

Now, the circuit operations of the 3-value levels applied to the input terminal 1 are explained. First, when the input terminal 1 is in an open state, the bias voltage is applied from the voltage dividing circuit constituted by the resistors 14 and 15 so that the potential at the input terminal 1 becomes 2.5V. Thus, both the first NMOS 7 and the second PMOS 8 turn to a cut-off state. That is, since the current does not flow to the first PMOS 6 connected to the first NMOS 7, the potential of the drain of the first PMOS 6 rises. Therefore, the output of the first output inverter 12 turns to a low level so that the output from the first output terminal 2 is at a low level. On the other hand, no current flows to the second NMOS 9 connected to the second PMOS 8 either so that the drain voltage of the NMOS 9 falls. Thus, the output of the second output inverter 13 connected to the drain of the second NMOS 9 turns to a high level, and the second output terminal 3 outputs a high level voltage.

In effect, when the input terminal 1 is in an open state, the first output terminal 2 is at a low level and the second output terminal 3 is at a high level. Also, when the input terminal 1 is in an open state, the first NMOS 7 and the second PMOS 8 are both in a cut-off state and, since there is no path for the current to flow, the current consumption is extremely small.

Next, when the low level voltage is applied to the input terminal 1, the first NMOS 7 becomes conductive, and the current flows from the power source VDD to the input terminal 1 through the first PMOS 6 and the first NMOS 7. Thus, the potential of the interconnection point at the first PMOS 6 falls and the output of the first output inverter 12 turns to a high level. On the other hand, since the second PMOS 8 is cut off, no current flows to the second NMOS 9. Therefore, the drain potential of the second NMOS 9 falls and the output of the second output inverter 13 turns to a high level. That is, when the low level voltage is applied to the input terminal 1, both the first output terminals 2 and 3 turn to a high level.

When the high level voltage is applied to the input terminal 1, the second PMOS 8 becomes conductive, and the current flows from the input terminal 1 to the ground terminal GND through the second PMOS 8 and the second NMOS 9. Thus, the potential of the interconnection point at the second NMOS 9 falls, and the output of the second output inverter 13 turns to a low level. On the other hand, since the first NMOS 7 is cut off, no current flows to the first PMOS 6. Therefore, the drain potential of the first PMOS 6 rises, and the output of the first output inverter 12 turns to a low level. That is, when the high level voltage is applied to the input terminal 1, both the first output terminals 2 and 3 turn to a low level.

Figure 4:
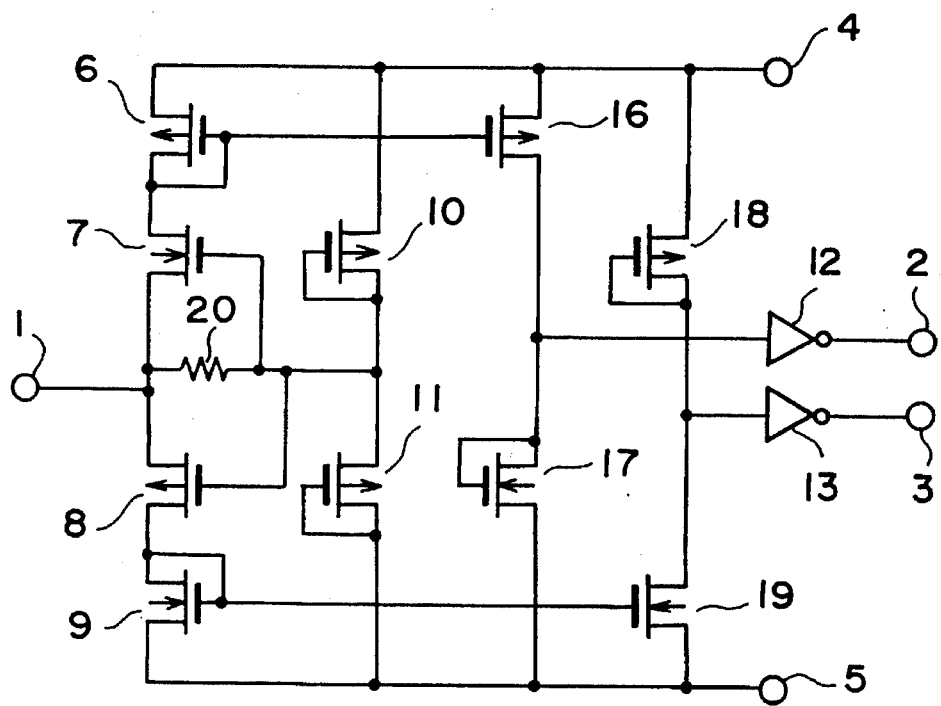
FIG. 4 is a circuit diagram showing a second embodiment of a 3-value input buffer circuit according to the invention.

FIG. 4 is a circuit diagram showing a 3-value input buffer circuit of a second embodiment according to the invention. As shown therein, the difference here from the first embodiment resides in the provision of third and fourth PMOSs 16 and 18, third and fourth NMOSs 17 and 19, and a bias resistor 20 that replaces the resistors 14 and 15 in the first embodiment shown in FIG. 3. In this embodiment, too, two PMOSs 10 and 11 constitute a voltage dividing circuit as a voltage applying means, and the potential at an intermediate point thereof is set to 2.5V. This voltage is applied to the gates of the first NMOS 7 and the second PMOS 8. Also, the sources of the first NMOS 7 and the second PMOS 8 are commonly connected to the input terminal 1. Thus, when the potential of the input terminal 1 becomes lower than (2.5V−$V_{TN}$), the first NMOS 7 turns to a conductive state and, at a voltage higher than that potential, the first NMOS 7 turns to a cut-off state. On the other hand, when the potential of the input terminal 1 becomes higher than (2.5V+$V_{TP}$), the second PMOS 8 turns to a conductive state and, at a voltage lower than that potential, the second PMOS 8 turns to a cut-off state. Here, $V_{TN}$ and $V_{TN}$ represent the threshold voltages of the respective transistors.

Now, similarly as for the first embodiment, the circuit operations of the 3-value levels are explained. First, when the input terminal 1 is in an open state, the bias voltage is applied from the voltage dividing circuit constituted by the two PMOSs 10 and 11 so that the potential at the input terminal 1 becomes 2.5V. Thus, both the first NMOS 7 and the second PMOS 8 turn to a cut-off state. Consequently, the current does not flow to the first PMOS 6 connected to the first NMOS 7, and the current does not flow to the third PMOS 16 constituting a current mirror with respect to the first PMOS 6, either. The third NMOS 17 connected to the drain of this third PMOS 16 operates as a load resistor (active load) but, since the current does not flow therethrough, the interconnection point between the third PMOS 16 and the third NMOS 17 falls. Therefore, the output of the first output inverter 12 connected to the drain of the third PMOS 16 turns to a high level so that the output from the first output terminal 2 is at a high level. On the other hand, since no current flows to the second NMOS 9 connected to the second PMOS 8, the current does not flow to the fourth NMOS 19 constituting a current mirror with respect to the second NMOS 9, either. The fourth PMOS 18 connected to the drain of the fourth NMOS 19 operates as a load resistor (active load) but, since no current flows, the potential at the interconnection point between the fourth NMOS 19 and fourth PMOS 18 rises. Thus, the output of the second output inverter 13 connected to the drain of the fourth NMOS 19 turns to a low level and the output of the second output terminal 3 is at a low level.

In effect, when the input terminal 1 is in an open state, the first output terminal 2 is at a high level and the second output terminal 3 is at a low level. Also, when the input terminal 1 is in an open state, the first NMOS 7 and the second PMOS 8 are both in a cut-off state and, since there is no path for the current to flow, the current consumption is extremely small.

Next, when the low level voltage is applied to the input terminal 1, the first NMOS 7 becomes conductive, and the current flows from the power source VDD to the input terminal 1 through the first PMOS 6 and the first NMOS 7. However, since the first PMOS 6 and the third PMOS 16 constitute a current mirror circuit, the current proportional to the current that flows to the first PMOS 6 flows to the third PMOS 16. Due to the current flow from this third PMOS 16 to the third NMOS 17, the potential at the interconnection point therebetween rises. Therefore, the output of the first output inverter 12 connected to this interconnection point turns to a low level. On the other hand, the second PMOS 8 is cut off so that no current flows to the second NMOS 9. Therefore, the current does not flow to the fourth NMOS 19 constituting a current mirror with respect to the second NMOS 9 either so that no current flow to the drain thereof. Thus, the output of the second output inverter 13 connected to that drain rises. That is, when the low level voltage is applied to the input terminal 1, both the first and second output terminals 2 and 3 turn to a low level.

Next, when a high level voltage is applied to the input terminal 1, the second PMOS 8 turns to a conductive state, and the current flows to the ground terminal GND through the second PMOS 8 and the second NMOS 9. Similarly, since this second NMOS 9 and the fourth NMOS 19 constitute a current mirror circuit, the current proportional to the current that flows to the second NMOS 9 flows to the fourth NMOS 19. Due to the flow of current from the fourth NMOS 19 to the fourth PMOS 18, the potential at the interconnection point thereof falls. Thus, the output of the second output inverter 13 connected to this interconnection point turns to a high level. On the other hand, since the first NMOS 7 is cut off, no current flows to the first PMOS 6. Thus, no current flows to the third PMOS 16 constituting a current mirror with respect to the first PMOS 6 either so that the drain potential falls. Therefore, the output of the first output inverter 12 connected to the drain turns to a high level. That is, when the low level voltage is applied to the input terminal 1, both the first and second output terminals 2 and 3 turn to a high level.

In this embodiment, the third PMOS 16 together with the third NMOS 17 and the fourth NMOS 19 together with the fourth PMOS 18 in effect operate as an amplifier, so that it is possible to reduce the through-current that may occur when the state of the input terminal 1 undergoes changes. Furthermore, in this embodiment, since the intermediate point of the PMOSs 10 and 11 is connected to the input terminal 1 through the bias resistor 20, and the bias voltage is applied to the input terminal 1, this can reduce the number of resistor elements thereby contributing to reducing the circuit area and miniaturizing the circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A 3-value input buffer circuit comprising:

a power source terminal and a ground terminal;

an input terminal whose input state assumes an open level, a high level and a low level;

a first N-channel MOS transistor having a source connected to said input terminal;

a first P-channel MOS transistor having a gate and a drain both connected to a drain of said first N-channel MOS transistor and a source connected to said power source terminal;

a first output circuit having an input node coupled to said drain of said first P-channel MOS transistor and an output node connected to a first output terminal;

a second P-channel MOS transistor having a source connected to said input terminal;

a second N-channel MOS transistor having a gate and a drain both connected to a drain of said second P-channel MOS transistor and a source connected to said ground terminal;

a second output circuit having an input node coupled to said drain of said second N-channel MOS transistor and an output node connected to a second output terminal; and a voltage applying means which applies a constant voltage to a gate of each of said first N-channel MOS transistor and said second P-channel MOS transistor.

2. The 3-value input buffer circuit according to claim 1, further comprising a first amplifier circuit connected between the drain of said first P-channel MOS transistor and said input node of said first output circuit, and a second amplifier circuit connected between the drain of said second N-channel MOS transistor and said input node of said second output circuit.

3. The 3-value input buffer circuit according to claim 2, wherein said first amplifier circuit comprising:

a third P-channel MOS transistor having a gate connected to the drain of said first P-channel MOS transistor, a source connected to said power source terminal, and a drain connected to the input node of said first output circuit, said third P-channel MOS transistor together with said first P-channel MOS transistor constituting a first current-mirror circuit; and a third N-channel MOS transistor having a gate and a drain both connected to said drain of said third P-channel MOS transistor and a source connected to said ground terminal, said third N-channel MOS transistor operating as an active load for said third P-channel MOS transistor, and wherein said second amplifier circuit comprising:

a fourth N-channel MOS transistor having a gate connected to the drain of said second N-channel MOS transistor, a source connected to said ground terminal, and a drain connected to the input node of said second output circuit, said fourth N-channel MOS transistor together with said second N-channel MOS transistor constituting a second current-mirror circuit; and a fourth P-channel MOS transistor having a gate and a drain both connected to said drain of said fourth N-channel MOS transistor and a source connected to said power source terminal, said fourth P-channel MOS transistor operating as an active load for said fourth N-channel MOS transistor.

4. The 3-value input buffer circuit according to claim 1, wherein said first output circuit and said second output circuit are formed by a first inverter and a second inverter, respectively.

5. The 3-value input buffer circuit according to claim 1, wherein said voltage applying means is a voltage dividing circuit constituted by two P-channel MOS transistors connected in series between said power source terminal and said ground terminal, said constant voltage applied to said gates of said first N-channel MOS transistor and said second P-channel MOS transistor being derived from an interconnection point of said two P-channel MOS transistors.

6. The 3-value input buffer circuit according to claim 1, further comprising a bias circuit for supplying a bias voltage to said input terminal.

7. The 3-value input buffer circuit according to claim 6, wherein said bias circuit is a voltage dividing circuit formed by two resistors connected between said power source terminal and said ground terminal, said bias voltage being derived from an interconnection point of said two resistors.

8. The 3-value input buffer circuit according to claim 6, wherein said bias circuit is formed by a bias resistor connected between said input terminal and said gates of said first N-channel MOS transistor and said second P-channel MOS transistor.

* * * * *